United States Patent
Hayama et al.

[11] Patent Number: 6,104,204
[45] Date of Patent: *Aug. 15, 2000

[54] SEMICONDUCTOR DEVICE TESTING APPARATUS

[75] Inventors: Hisao Hayama, Gyoda; Toshio Goto, Kumagaya; Yukio Kanno, Gyoda, all of Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/076,665

[22] Filed: May 12, 1998

[30] Foreign Application Priority Data

May 12, 1997 [JP] Japan .................................. 9-120690

[51] Int. Cl.⁷ .................................................. G01R 31/26
[52] U.S. Cl. .................... 324/760; 324/765; 324/158.1
[58] Field of Search ..................... 324/760, 765, 324/158.1

[56] References Cited

U.S. PATENT DOCUMENTS

| | | | |
|---|---|---|---|
| 3,408,565 | 10/1968 | Frick, et al. | 324/158 |
| 4,782,291 | 11/1988 | Blandin . | |
| 4,904,934 | 2/1990 | Nishihashi et al. | 324/158 |
| 4,926,118 | 5/1990 | O'Connor, et al. | 324/158 |
| 5,172,049 | 12/1992 | Kiyokawa et al. | 324/765 |
| 5,198,752 | 3/1993 | Miyata et al. . | |

*Primary Examiner*—Glenn W. Brown
*Attorney, Agent, or Firm*—Gallagher & Lathrop; David N. Lathrop

[57] ABSTRACT

An IC tester is provided which is capable of preventing the temperature of an IC heated to a predetermined temperature from falling during the test. A box-like housing 70 constructed of a thermally insulating material is mounted on a performance board PB. An IC socket SK and a socket guide 35 are accommodated in a space bounded by the box-like housing 70 and the performance board PB. A through-aperture 71 is formed in the top wall of the housing 70 for passing an IC under test carried by a movable rod 60R of a Z-axis driver into and out of the interior of the housing 70. An opening/closing plate 72 is disposed over the housing 70 for movement in a horizontal direction. This plate 72 is adapted to close the through-aperture 71 of the housing 70 when the movable rod 60R is outside of the housing to thereby maintain the interior of the box-like 70 in an almost thermally insulated condition. In addition, a cover member 64 is disposed for closing the through-aperture 72A in the plate 72 when the IC under test is in contact with the IC socket to aid in maintaining the interior of the housing in a thermally insulated condition.

28 Claims, 8 Drawing Sheets

SEMICONDUCTOR DEVICE TESTING APPARATUS

BACKGROUND OF THE INVENTION

1. Field of the Invention

The present invention relates to a semiconductor device testing apparatus having connected thereto a semiconductor device transporting and handling apparatus (commonly called handler) for transporting semiconductor devices (such as semiconductor device integrated circuits) for testing purposes, and sorting out the tested semiconductor devices on the basis of the test results, and more particularly to improvements on that portion of the semiconductor device testing apparatus for testing/measuring semiconductor devices to be tested as brought into the testing or test section by the semiconductor device transporting and handling apparatus (as will be referred to as handler hereinafter).

2. Description of the Related Art

As is well known, many semiconductor device testing apparatuses (commonly called IC tester) for testing various types of semiconductor devices including semiconductor device integrated circuits (as will be referred to as IC hereinafter) have a handler connected thereto for transporting a semiconductor device to be tested or under test (commonly called DUT) to the test section to be brought into electrical and mechanical contact with a device-testing socket of the semiconductor device testing apparatus (as will be referred to as IC tester hereinafter) disposed in the test section thereof, and after testing, carrying the tested semiconductor device out of the test section for transport to a predetermined location.

Since the present invention is concerned with the IC tester of the type having a handler connected thereto, one example of the IC tester of this type will first be described with reference to FIGS. 4 and 5. For simplicity of description, the invention will be described in the following disclosure by taking the IC tester designed for testing ICs which are typical of semiconductor devices by example.

Figure 4:
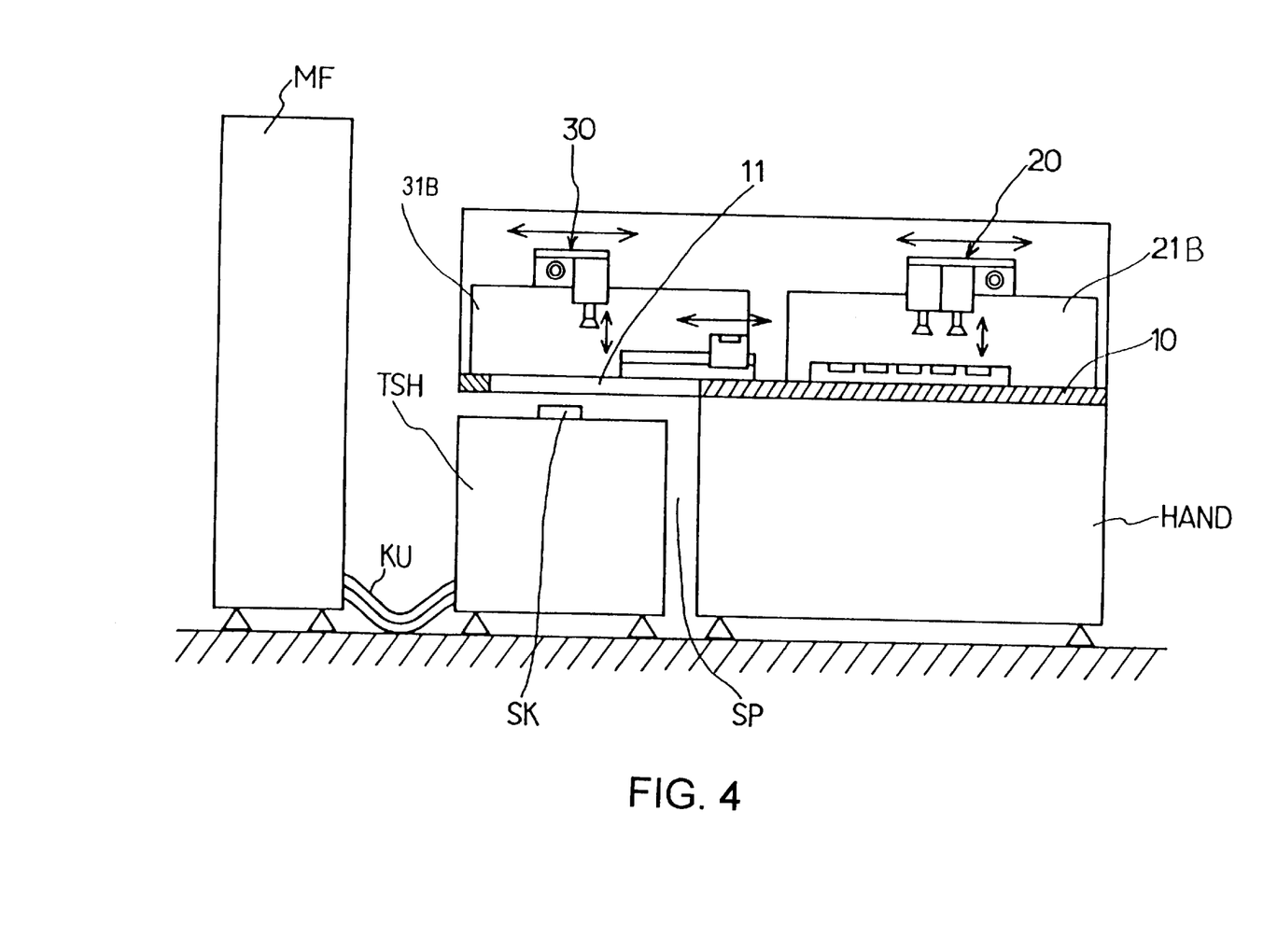
FIG. 4 is a side view, partly in cross-section, illustrating the general construction of one example of the IC tester to which the present invention is applied.
Figure 5:
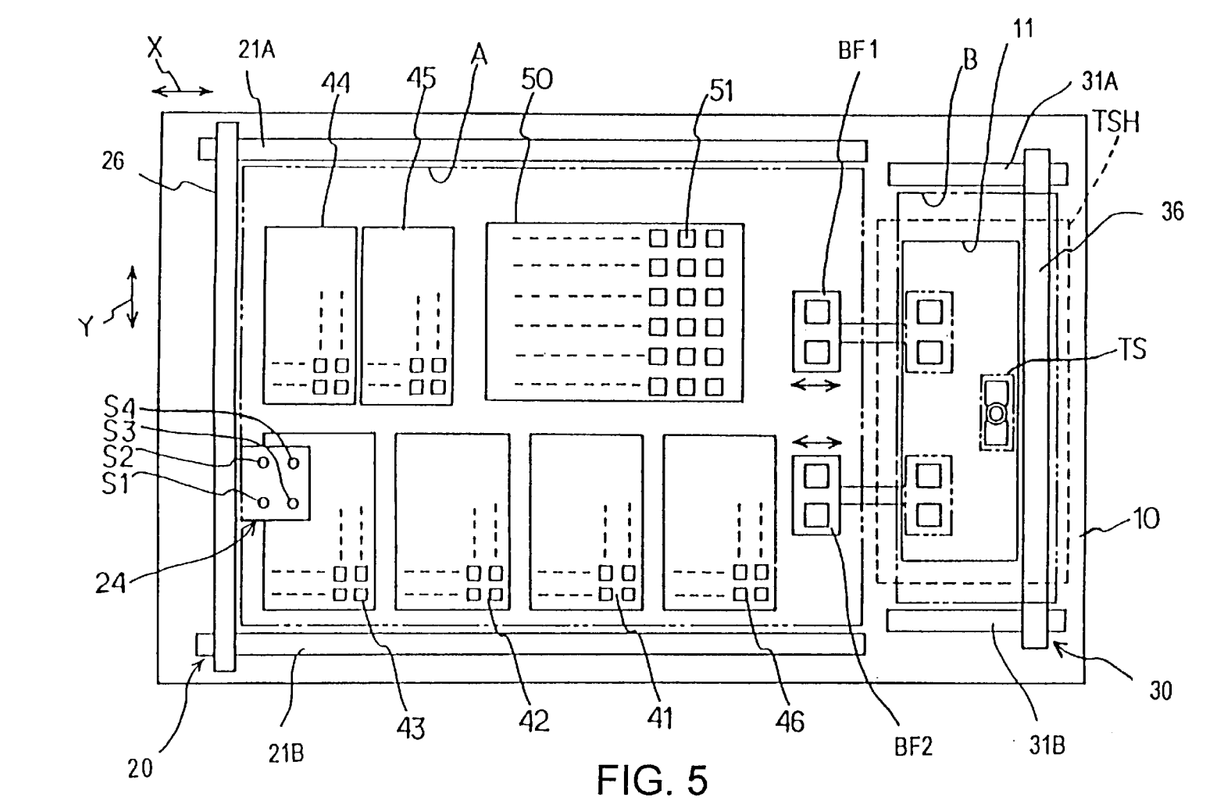
FIG. 5 is a plan view illustrating the construction of the IC tester shown in FIG. 4.

FIGS. 4 and 5 are a side view, partly in cross-section, showing the general construction of the conventional IC tester suitable for use for testing multiple-pinned ICs with built-in logic circuitry or analog circuitry among others, and a plan view illustrating the conventional handler, respectively.

The IC tester shown in FIG. 4 comprises a tester proper (which is known as main frame in the art concerned) MF in which electrical and electronic circuits and devices among other components are accommodated, a handler HAND equipped with a transporting mechanism for transporting ICs, and a test head TSH electrically connected with but constructed separately from the tester proper MF and mounted in the test section of the handler HAND.

The handler HAND comprises a base plate 10, and the IC transporting mechanism including first X-Y transport apparatus 20, second X-Y transport apparatus 30, and Z-axis driving apparatus (which is an apparatus adapted to move articles in a vertical direction (upward and downward directions) as viewed in FIG. 4), all being disposed on the base plate 10. Further, the base plate 10 includes an extension extending horizontally as viewed in the drawing beyond the handler and defining a space SP therebelow where the test head TSH is disposed. In addition, the extension of the base plate 10 is formed with a through-aperture 11 sized enough for an IC under test to pass through, so that an IC to be tested may be lowered through this through-aperture 11 to be placed into an IC socket SK mounted on the test head TSH.

ICs under test which have been transported into the test section by the IC transporting mechanism of the handler HAND are brought into electrical contact with the IC socket SK mounted on the test head TSH of the tester proper MF, and hence electrically connected with the tester proper MF through the test head TSH and a bundle of cables KU. A test signal of a predetermined pattern as supplied from the tester proper MF through the bundle of cables KU is applied to the IC under test, and response signals read out of the IC under test are transmitted from the test head TSH to the tester proper MF through the bundle of cables KU to measure the electrical characteristics of the IC.

Accommodated in the test head TSH are mainly a gang of drivers for applying a test signal of a predetermined pattern to ICs under test, a gang of comparators CP each for determining whether the output signals read out of the IC under test are a high (H) logic signal or a low (L) logic signal having a predetermined value of voltage, respectively, power lines, and the like, these components and the power lines being electrically connected with the tester proper MF through the bundle of cables KU.

Upon the test being completed, the tested ICs are carried from the IC socket SK to a predetermined location by the IC transporting mechanism of the handler HAND and subsequently are sorted out on the basis of the test results.

FIG. 5 is a plan view illustrating the general construction of the IC tester, particularly of the handler HAND. This handler HAND includes the first and second X-Y transport apparatus 20 and 30 which are capable of transporting articles in both the X- and Y-axis directions, the first and second X-Y transport apparatus 20 and 30 being disposed on the generally rectangular base plate 10 in longitudinally (in the right to left direction as viewed in the drawing) opposed relation to each other. The longitudinal direction is referred to as X-axis direction herein.

The first X-Y transport apparatus 20 includes a pair of first parallel X-axis rails 21A, 21B extending for a predetermined length in the X-axis direction over and along the opposite major lateral sides of the base plate 10 from adjacent the left end thereof as viewed in the drawing, a first movable arm 26 spanning the X-axis rails 21A, 21B orthogonally therewith and movably mounted on the rails in the X-axis direction therealong, and a first X-Y carrying head 24 mounted on the movable arm 26 for movement therealong in the Y-axis direction.

The second X-Y transport apparatus 30 includes a pair of second parallel X-axis rails 31A, 31B extending for a predetermined length in the X-axis direction over and along the opposite major lateral sides of the base plate 10 from adjacent the left end thereof as viewed in the drawing, a second movable arm 36 spanning the X-axis rails 31A, 31B orthogonally therewith and movably mounted on the rails in the X direction therealong, and a second X-Y carrying head (not shown) mounted on the movable arm 36 for movement therealong in the Y direction.

With this arrangement, the first X-Y carrying head 24 is movable by the first X-Y transport apparatus 20 constructed as described above to any desired point within the generally rectangular area (A) defined between the pair of first X-axis rails 21A, 21B as shown in dotted lines while the second X-Y carrying head is likewise movable by the second X-Y transport apparatus 30 to an) desired point within the generally rectangular area (B) defined between the pair of second X-axis rails 31A, 31B as shown in dotted lines. That is, the area (A) is the region within which the first X-Y transport apparatus 20 is capable of transporting articles while the area (B) is the transportable region of the second X-Y transport apparatus 30.

Disposed in the lower portion of the area (A) successively from the right side to the left side as viewed in the drawing are an empty tray storage section 46 for accommodating empty trays stacked one on another, a feed tray 41 loaded with ICs to be tested (ICs under test), two 42 and 43 of sorting trays 42, 43, 44 and 45 for sorting and storing tested ICs on the basis of the test results. The remaining two sorting trays 44 and 45, and a planar heater plate 50 for heating ICs under test to a predetermined temperature are disposed successively from the left to right side in the upper portion of the area (A) as viewed in the drawing. It is needless to say that the arrangement of the trays 41–45, the empty tray storage section 46 and the heater plate 50 and the number of the sorting trays 42–45 are illustrated herein as only one example and that they may be varied as required.

Disposed within the area (B) is the test section TS of the IC tester within which there are mounted IC sockets with which ICs under test are to be put into electrical contact. As the illustrated handler is configured to test two ICs under test at one time, the test section TS is equipped with two sockets.

The illustrated handler is further provided with first and second buffer stages BF1 and BF2, respectively, which are reciprocally movable in the X-axis direction between a predetermined position in the area (A) and a predetermined position in the area (B). More specifically, the first buffer stage BF1 is reciprocally movable in the X-axis direction between that section within the area (A) adjacent the right hand side of the heater plate 50 and a predetermined position in the area (B) while the second buffer stages BF2 is reciprocally movable in the X-axis direction between that section within the area (A) adjacent the right hand side of the empty tray storage section 46.

The first buffer stage BF1 performs the function of transferring ICs under test heated to a predetermined temperature from the area (A) to the area (B) while the second buffer stages BF2 acts to carry the tested ICs from the area (B) to the area (A). It is to be understood that the provision of these buffer stages BF1 and BF2 permits the first and second X-Y transport apparatus 20 and 30 to accomplish their transport operations with no interference with each other.

The first X-Y transport apparatus 20 described above is configured to convey ICs under test to the heater plate 50 for applying a predetermined temperature stress to the ICS, and then perform the operation of transferring the ICs under test heated to a predetermined temperature onto the first buffer stage BF1 and the operation of transferring the tested ICs from the second buffer stage BF2 onto the predetermined sorting trays which tested ICs have been transported from the area (B) to the area (A) by the second buffer stage BF2.

On the other hand, the second X-Y transport apparatus 30 is configured to perform the operation of transporting ICs under test as conveyed by the first buffer stage BF1 into the area (B) to the test section TS and the operation of transferring the tested ICs from the test section TS onto the second buffer stage BF2.

The heater plate 50 described above may be formed of plate-like metal stock for example, and is provided with a plurality of IC receiving recesses or pockets 51 for accommodating ICs under test. ICs being tested are transported from the feed tray 41 into these IC receiving recesses 51 by the first X-Y transport apparatus 20. These IC receiving recesses 51 are typically arrayed in the form of a matrix composed of a plurality of rows and a plurality of columns.

The heater plate 50 is maintained in an elevated temperature somewhat higher than the temperature to which ICs being tested are to be applied. The ICs being tested are thus heated to a predetermined temperature before being transported by means of the first buffer stage BF1 to the test section TS.

The first and second X-Y transport apparatus 20 and 30 are each provided with their own Z-axis driving apparatus (each of which is adapted to convey an IC in a vertical direction (Z-axis direction)) which perform the operation of picking up ICs out of the trays, the heater plate 50 or the test section TS (sockets) and the operation of dropping off ICs onto the trays, the heater plate 50 or the test section TS.

Figure 6:
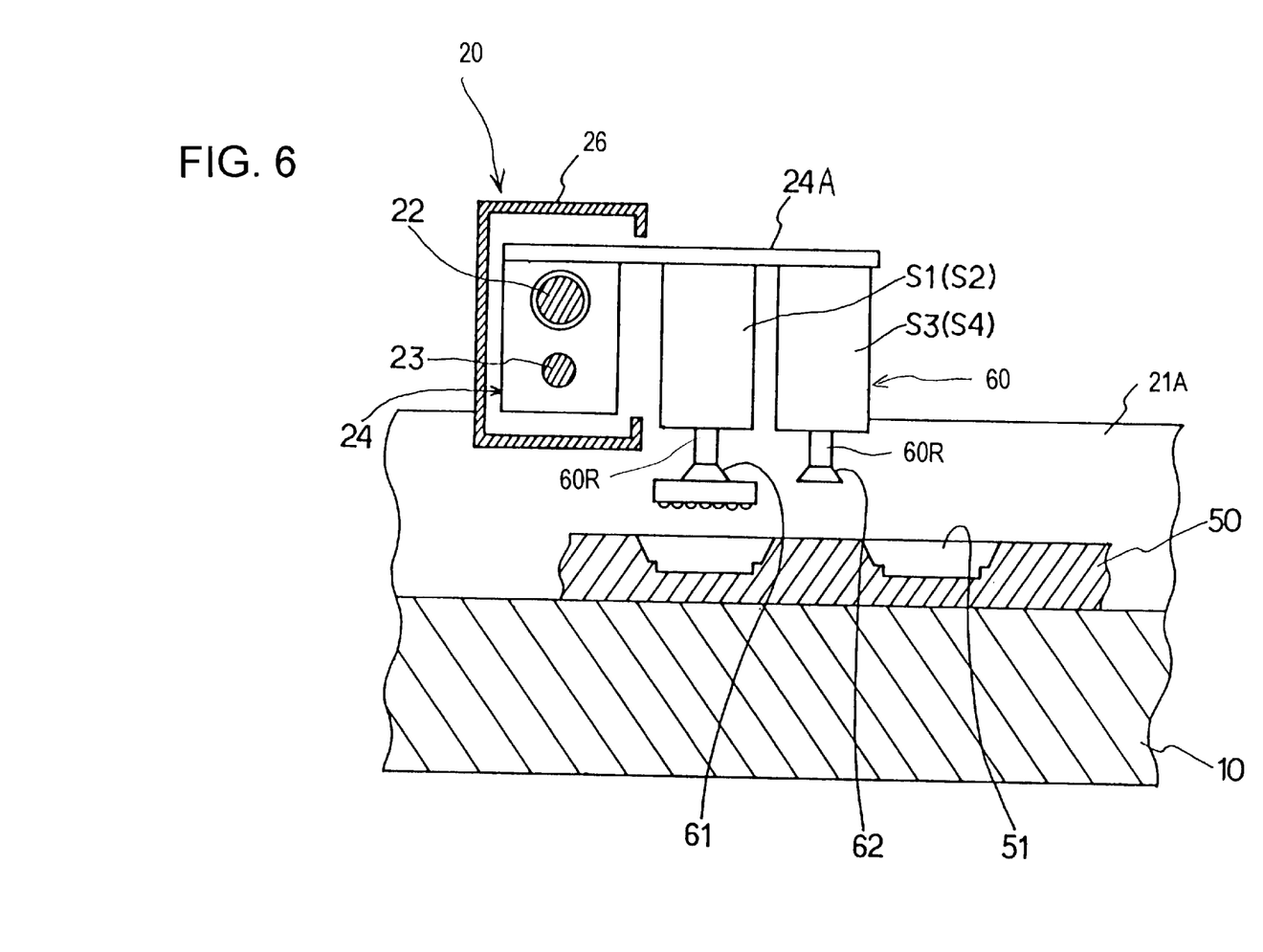
FIG. 6 is an enlarged cross-sectional view illustrating the construction of the Z-axis driving apparatus of the IC tester shown in FIG. 4.

FIG. 6 illustrates the general construction of one example of the Z-axis driving apparatus mounted on the first X-Y transport apparatus 20. The movable arm 26 extending in the Y-axis direction of the first X-Y transport apparatus 20 comprises a hollow member having a generally C-shaped cross-section, in the hollow interior of which a threaded shaft 22 and a guide shaft 23 likewise extending in the Y-axis direction are housed. Specifically, the threaded shaft 22 and guide shaft 23 extend in the Y-axis direction through the body portion of the first X-Y carrying head 24 which is formed with threads engageable with the threads of the threaded shaft 22. The guide shaft 23 has no threads thereon so as to permit sliding movement of the body portion of the first X-Y carrying head 24 relative to the guide shaft 23 which in turn acts to stabilize the movement of the X-Y carrying head 24 in the Y-axis direction.

With the construction as described above, driven rotation of the threaded shaft 22 will move the first X-Y carrying head 24 in the Y-axis direction in a stable manner. It is to be noted that the movement of the X-Y carrying head 24 in the X-axis direction is effected by the movement of the movable arm 26 in the X-axis direction.

Extending horizontally (in the X-axis direction as viewed in FIG. 5) from the top of the body portion of the first X-Y carrying head 24 is an arm 24A on the underside of which are mounted a plurality of vertically downwardly extending air cylinders, four air cylinders in this example, that is, first, second, third and fourth air cylinders S1, S2, S3 and S4 as shown in FIG. 5. In FIG. 6, the second air cylinder S2 is invisible as it is hidden behind the first air cylinder S1. Likewise, the fourth air cylinder S4 is invisible as it is hidden behind the third air cylinder S3. Each of the movable rods of the air cylinders S1, S2, S3 and S4 has a vacuum pick-up head mounted on its lower end.

While in the illustrated example the Z-axis driving apparatus 60 is adapted to actuate the first and second air cylinders S1 and S2 in a pair and the third and fourth air cylinders S3 and S4 in a pair so as to vacuum attract two ICs at a time thereagainst for transport, this is only an example.

One set of the first and second air cylinders S1 and S2 are employed to transport ICs under test heated to a predetermined temperature in the heater plate 50 to the first buffer stage BF1. In view of this, the vacuum pick-up heads 61 (shown as having ICs under test attracted thereagainst) mounted on the first and second air cylinders S1 and S2 are equipped with heaters (not shown) for maintaining the temperature of the heated ICs under test. The vacuum pick-up heads 62 mounted on the other set of the third and fourth air cylinders S3 and S4 are equipped with no heaters, because they are used to transport ICs at their normal temperature. Specifically, the vacuum pick-up heads 62 are used when transporting ICs from the feed tray 41 to the heater plate 50 and the tested ICs from the second buffer stage BF2 to corresponding one of the sorting trays 42, 43, 44 and 45.

The second carrying head, not shown, mounted on the movable arm 36 of the second X-Y transport apparatus 30 is also provided with a Z-axis driving apparatus similar in construction to the Z-axis driving apparatus 60. However, since the second X-Y transport apparatus 30 is positioned in a mirror-image relation with the first X-Y transport apparatus 20, the movable arm 36 has a configuration symmetrical with respect to that of the movable arm 26 as shown in FIG. 6 (the movable arm 26 is open on its right-hand side whereas the movable arm 36 is open on its left-hand side), and four air cylinders are mounted on the left side of the movable arm 36. It should be noted that in the second carrying head as well, the Z-axis driving apparatus is adapted to actuate the first and second air cylinders in a pair and the third and fourth air cylinders in a pair so as to vacuum attract two ICs at a time thereagainst for transport. One set of the air cylinders are employed when transporting ICs under test heated to a predetermined temperature from the first buffer stage BF1 to the test section TS. In view of this, the vacuum pick-up heads mounted on these cylinders are equipped with heaters for maintaining the temperature of the heated ICs under test. The vacuum pick-up heads mounted on the other set of air cylinders are equipped with no heaters and are used when transporting ICs at their normal temperature, that is, from the test section TS to the second buffer stage BF2. It will be apparent to those skilled in the art the construction of the Z-axis driving apparatus may be modified in various ways.

The IC tester of the type as described above is configured to heat ICs under test to a predetermined temperature in the heater plate 50 and test the ICs while maintained at that predetermined temperature. There is a considerably much demand for the IC tester of the type utilizing a simplified type of heater means such as the heater plate 50 as described above, because of the high initial cost of the IC tester of the type utilizing a constant temperature chamber capable of maintaining ICs under test heated at a predetermined temperature and employing the test section TS enclosed in the constant temperature chamber to effect the testing.

Figure 7:
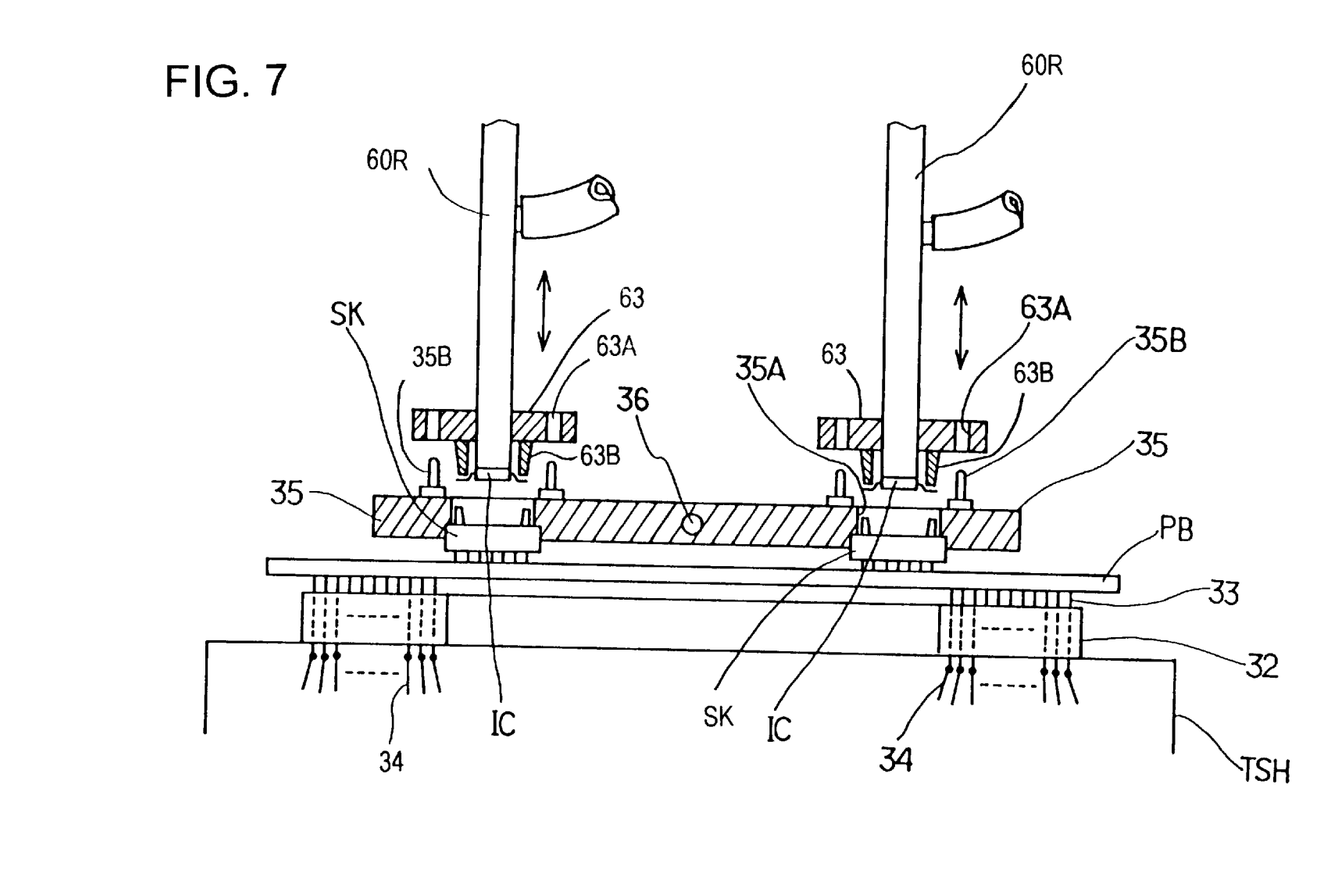
FIG. 7 is a schematic cross-sectional view illustrating the arrangement of the test head TSH, the IC sockets SK and the socket guide among others of the IC tester shown in FIG. 4.
Figure 8:
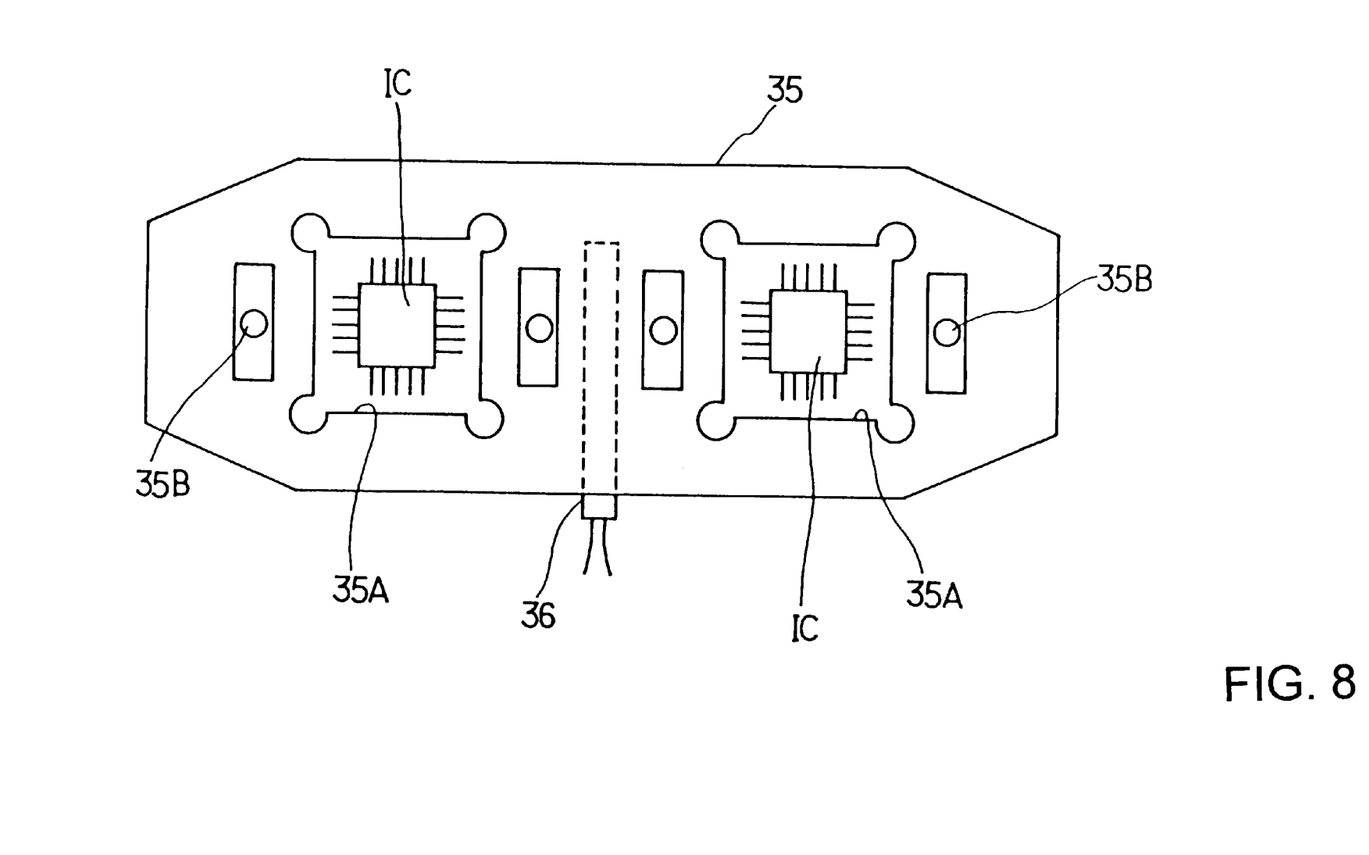
FIG. 8 is a plan view illustrating the socket guide shown in FIG. 7.

On the other hand, the IC sockets SK attached to the test head TSH are associated with a socket guide. FIGS. 7 and 8 illustrate the detailed construction of one example of the socket guide.

FIG. 7 is a schematic cross-sectional view illustrating the arrangement of the test head TSH, the IC sockets SK and the socket guide 35, and FIG. 8 is a plan view illustrating the socket guide 35. Affixed to the top of the test head TSH is an annular coupling 32 called flog ring on the top of which is a performance board PB.

The flog ring 32 is a member for electrically connecting the test head TSH and the performance board PB and has annular arrays of pogo contact pins 33 mounted thereto so as to extend from the surface of the ring. The pogo contact pins (which will be referred to as pogo pin) 33 are movable contact pins supported by springs for movement in a direction perpendicular to the surface of the flog ring 32 and are normally biased by the springs in a sense to protrude from the surface of the flog ring 32. These pogo pins 33 are electrically connected with the terminals extending from the undersurface of the flog ring 32, which terminals are in turn electrically connected with the corresponding cables 34 within the interior of the test head TSH.

Mounted on the top surface of the performance board PB are IC sockets SK, two in this example, the terminals of which are electrically connected via the printed wiring in the performance board PB with the corresponding terminal portions of the performance board PB which are to be contacted with the pogo pins 33. It is thus to be understood that the terminals of the IC sockets are electrically connected with the test head TSH via the printed wiring (conductors) and terminal portions of the performance board PB, the pogo pins 33 and the cables 34.

The socket guide 35 surrounds and is mounted on the upper portions of the peripheries of the IC sockets SK. As illustrated in FIG. 8, the socket guide 35 is formed of a generally rectangular plate-like metal block greater by predetermined dimensions than the planar space occupied by two IC sockets SK and has formed therethrough IC guide apertures 35A at locations corresponding to the IC sockets SK. ICs being tested are inserted through the IC guide apertures 35A into the socket guide 35 to be contacted with the IC sockets SK.

It is the Z-axis driving apparatus mounted on the second X-Y transport apparatus that moves ICs under test vertically (upwardly and downwardly) to place them into contact with the IC sockets SK as described before. In FIG. 7, only the movable rods 60R of the Z-axis driving apparatus on which the vacuum pick-up heads are mounted are shown for convenience of simplicity.

Upstanding from the top surface of the socket guide 35 are two guide pins 35B positioned one approximately at the middle point along each of the opposite sides (sides opposed longitudinally of the socket guide 35) of each of the IC guide aperture 35A. The guide pins 35B are configured to guide the associated movable rod 60R of the Z-axis driving apparatus into position as it is lowered with the ICs under test carried thereby. On the other hand, surrounding and mounted to the movable rod 60R at a predetermined elevation is a plate-like guide member 63 having guide holes 63A formed therethrough in vertical alignment with the corresponding guide pins 35B. These guide holes 63A have an inner diameter to snugly fit over the associated guide pins 35B so that the IC under test vacuum attracted against the vacuum head of the movable rod 60R is precisely guided as it is lowered to place the pins of the IC under test into contact with the corresponding contact pins of the IC socket SK This insures an accurate registration of the IC under test with respect to the IC socket SK.

The guide member 63 has two pairs of protrusions 63B extending downwardly from the bottom surface thereof such that once the pins of the IC being placed into contact with the corresponding contact pins of the IC socket SK, these protrusions 63B hold down the pins of the IC being tested to positively maintain them in electrical contact with the socket pins. While in this example there are two pairs of protrusions 63B since the IC under test has pins extending out from four sides thereof as seen in FIG. 8, a frame-like protrusion may be employed in place of two pairs of protrusions. Further, it is needless to say that at least those portions of such protrusions which are to be contacted with the IC pins are made of electrically insulating material.

It has heretofore been a common practice to provide the socket guide 35 with heater means 36 for heating the socket guide 35 to maintain the temperature of the IC under test heated by the heater plate 50 during the test. However, since the IC guide apertures 35A formed through the socket guide 35 as well as the socket guide 35 itself are exposed to the atmosphere as is seen in FIG. 7, there is a substantial heat loss from the socket guide 35. Consequently, when a high temperature thermal stress on the order exceeding 125° C. was applied to the IC under test heated by the heater plate 50, it was difficult to maintain the temperature of the IC at that high temperature, even if the socket guide 35 had an increased heat capacity.

In addition, although the socket guide 35 is connected to a common point of potential to electromagnetically shield the peripheral portions of the IC sockets SK, the upper portions of the IC guide apertures 35A are exposed and yet no special electromagnetically shielding means is provided on the print wiring in the surface of the performance board PB and ICs to be tested; therefore, these components have no protection against external noises including the noise generated by the handler itself.

In the case where ICs to be tested are multiple-pinned devices with built-in logic circuitry or analog circuitry and others and where such devices are tested for their logic circuitry or analog circuitry in the high frequency region, ICs to be tested, the top surface of the IC sockets SK and the print wiring in the surface of the performance board PB would be very likely to be affected by external noises. The deleterious effects by external noises would cause the serious problem of preventing accurate testing and measuring of ICs to be tested.

SUMMARY OF THE INVENTION

It is a first object of the present invention to provide a semiconductor device testing apparatus which is capable of preventing the temperature of semiconductor devices under test which have been heated to a predetermined temperature from falling, below a predetermined temperature during the test.

It is a second object of the present invention to provide a semiconductor device testing apparatus which is capable of conducting a test on semiconductor devices under test without subjecting them to deleterious effects by external noises.

According to the present invention, in a semiconductor device testing apparatus including a device socket attached to a test head, a socket guide comprising a thermally conductive block, the socket guide being adapted to surround the device socket and align an incoming semiconductor device as carried by a Z-axis drive means with the device socket, and a heat source for heating the socket guide, an improved semiconductor device testing apparatus is provided which comprises a box-like housing constructed of a thermally insulating material and substantially enclosing the device socket and the socket guide, a through-aperture formed in the top of the box-like housing for passing the incoming semiconductor device as carried by the Z-axis drive means into the interior of the box-like housing, and an opening or closing (opening/closing) means for selectively opening and closing the through-aperture formed in the top of the box-like housing, whereby the foregoing objects are accomplished.

In a first embodiment, the opening/closing means comprises a plate-like opening/closing member having a portion for closing the through-aperture formed in the top of the box-like housing and an opening portion for opening the through-aperture, the plate-like opening/closing member being disposed so as to be horizontally movable across the top of the box-like housing. The box-like housing encloses the device socket and the socket guide overlying the socket board.

In a first modified form, the opening/closing means comprises a cover member mounted on the Z-axis drive means and adapted to close the through-aperture formed in the top of the box-like housing upon the incoming semiconductor device as carried by the Z-axis drive means being brought into contact with the device socket within the box-like housing.

This cover member may be fixed to the Z-axis drive means at a predetermined position therealong or alternatively may be mounted on the Z-axis drive means for movement therealong. The cover member may be constructed of a thermally insulating material, or an electromagnetically shielding material, or thermally insulating material containing electromagnetically shielding material.

In a second modified form, the opening/closing means comprises a pair of opposed plate-like opening/closing members disposed on opposite sides of the through-aperture over the top of the box-like housing, the opposed plate-like opening/closing members being movable toward and away from each other. The pair of opposed plate-like opening/closing members may be constructed of thermally insulating material, or electromagnetically shielding material, or thermally insulating material containing electromagnetically shielding material.

In the first embodiment, a cover member is mounted on the Z-axis drive means, the cover member being adapted to close the opening portion of the plate-like opening/closing member when the opening portion of the plate-like opening/closing member has been moved to a position to open the through-aperture formed in the top of the box-like housing and the incoming semiconductor device as carried by the Z-axis drive means has been brought into contact with the device socket within the box-like housing.

This cover member for closing the opening portion of the plate-like opening/closing member may be fixed to the Z-axis drive means at a predetermined position therealong or may be mounted on said Z-axis drive means for movement therealong. The cover member may be constructed of a thermally insulating material, or an electromagnetically shielding material, or thermally insulating material containing electromagnetically shielding material. In addition, the cover member may have a hermetically sealing member attached to the undersurface thereof.

In a second embodiment, the device socket is attached to a socket board disposed at a predetermined distance above a performance board mounted to the test head, the box-like housing enclosing the device socket and the socket guide overlying the socket board.

In a third embodiment, the electromagnetically shielding material contained in the thermally insulating material is a sheet metal of meshes. The cover member is constructed of thermally insulating material containing electromagnetically shielding material while the hermetically sealing member attached to the undersurface of the cover member is constructed of electrically conductive material. In addition, the plate-like opening/closing member is constructed of electrically conductive material, the cover member for closing the opening portion of the plate-like opening/closing member is constructed of thermally insulating material containing electromagnetically shielding material, and the hermetically sealing member attached to the undersurface of the cover member is constructed of electrically conductive material.

With the construction described above, the interior of the box-like housing is maintained at a substantially constant temperature, and yet is electromagnetically shielded to eliminate the possibility of ingress of external noises during the test.

While the heat source for heating the socket guide to a predetermined temperature is illustrated as comprising an electric heater mounted in the socket guide in the embodiments disclosed herein, it is to be understood that either the interior of the box-like housing or the socket guide may be heated by any other suitable heat source such as air or gas.

DETAILED DESCRIPTION OF THE PREFERRED EMBODIMENTS

Some embodiments of the present invention will be described in details with reference to FIGS. 1–3.

Figure 1:
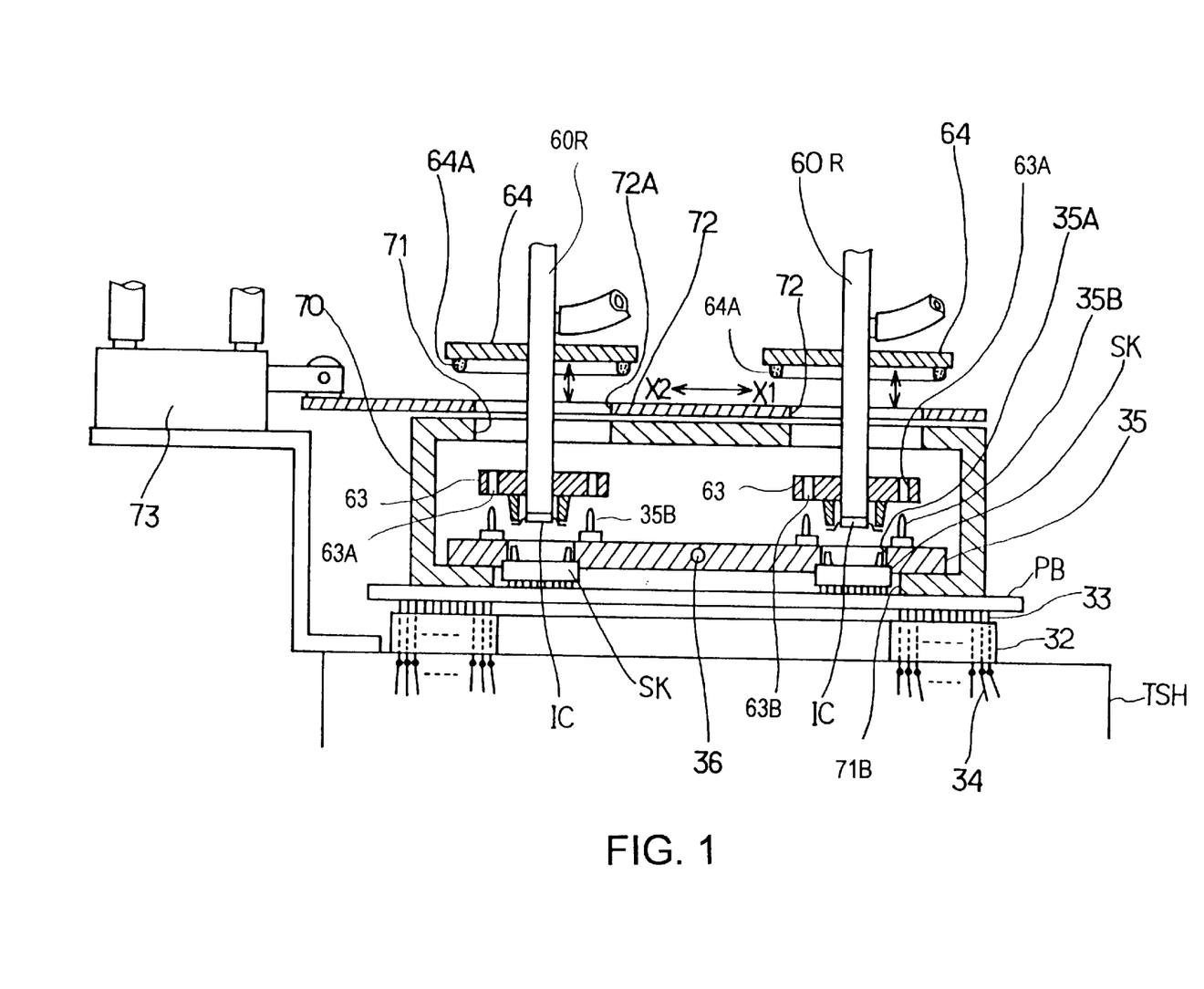
FIG. 1 is a schematic cross-sectional view illustrating the construction of the principal parts of a first embodiment of the semiconductor device testing apparatus according to the present invention.

FIG. 1 is a schematic cross-sectional view illustrating the construction of the principal parts of a first embodiment of the IC tester according to the present invention. In FIG. 1, those portions and components which correspond to those shown in FIGS. 7 and 8 are designated by like reference numerals and will not be discussed again in detail unless required.

According to the present invention, in the IC tester of the type previously described with reference to FIGS. 4–8, a box-like housing or case 70 is mounted on the performance board PB and the IC sockets SK and the socket guide 35 as described before with reference to FIGS. 7 and 8 are accommodated in the space bounded by the box-like housing 70 and the performance board PB. The box-like housing 70 is constructed of thermally insulating material such as glass fiber-reinforced resin, polyimide resin, silicone based resin and the like to thermally insulate the IC sockets SK and the socket guide 35 from the surrounding atmosphere.

Formed through the top wall of the box-like housing 70 are through-apertures 71 in vertical alignment with the corresponding, two in this example, IC sockets SK disposed in the interior of the housing. These through-apertures 71 are so sized as to permit passage of the movable rods 60R of the Z-axis driving apparatus and the guide members 63 mounted to the rods into and out of the interior of the box-like housing 70. Formed also through the bottom wall of the box-like housing 70 is an opening 71B which is closed by the socket guide 35 attached to the bottom wall of the box-like housing 70. The size of the opening 71B, although smaller than the socket guide 35, is selected as to accommodate two IC sockets SK attached to the performance board PB within the opening 71B.

It will thus be appreciated that as the Z-axis driving apparatus is actuated to lower the movable rods 60R, ICs vacuum attracted against the vacuum heads on the distal ends of the movable rods 60R are moved from above the box-like housing 70 into the interior thereof through the through-apertures 71 as the movable rods 60R descend, and precisely positioned by fitting of the guide holes 63A of the guide members 63 over the guide pins 35B so that the pins of the ICs under test are positively placed into contact with the corresponding contact pins of the IC socket SK. In this condition, a predetermined test is carried out, and upon completion of the test, the movable rods 60R are moved upwardly to transport the tested ICs as vacuum attracted against the vacuum heads on the distal ends of the movable rods 60R out of the box-like housing 70 through the through-apertures 71.

Disposed over the top wall of the box-like housing 70 is an opening or closing plate (opening/closing plate) 72 movable in the left-to-right directions (X1←→X2). The opening/closing plate 72 is formed with through-apertures 72A positioned so as to be vertically alignable with and having the same size of the through-apertures in the top wall of the box-like housing 70 such that the through-apertures 71 of the box-like housing 70 are selectively opened and closed as the opening/closing plate 72 is moved in the left-to-right directions by a linear drive source 73 such as an air cylinder.

The opening/closing plate 72 is moved toward the X1 direction by the extending action of the linear drive source 73 to close the through-apertures 71 of the box-like housing 70 by the solid portions (devoid of the apertures 72A) of the opening/closing plate 72 when the movable rods 60R of the Z-axis driving apparatus are outside of the box-like housing 70. It is thus to be understood that the interior of the box-like housing 70 is maintained in an approximately thermally insulated condition.

With the through-apertures 71 of the box-like housing 70 by the opening/closing plate 72, when the movable rods 60R pick up ICs to be tested and begin to descend, the linear drive source 73 moves the opening/closing plate 72 toward the X2 direction by its retracting action, so that the apertures 72A of the opening/closing plate 72 are brought into alignment with tie through-apertures 71 of the box-like housing 70 whereby the through-apertures 71 of the box-like housing 70 are opened (the state shown in FIG. 1). Then, ICs vacuum attracted against the movable rods 60R are moved through the apertures 72A of the opening/closing plate 72 and the through-apertures 71 of the box-like housing 70 into the interior of the housing 70 by the descending movable rods 60R, and are positively urged into contact with the IC sockets SK.

According to the present invention, cover members or closure members 64 are mounted on the movable rods 60R such that the cover members 64 will close the associated through-apertures 72A of the opening/closing plate 72 when ICs under test are in contact with the IC sockets SK. The cover members 64 have hermetically sealing members 64A affixed to the undersurface thereof. It can thus be appreciated that when ICs under test are in contact with the IC sockets SK the cover members 64 and sealing members 64A close the through-apertures 72A of the opening/closing plate 72 to thereby maintain the interior of the box-like housing 70 in an thermally insulated condition. Alternatively, the cover members 64 may be vertically slidably mounted on the movable rods 60R so that once ICs under test have been placed in contact with the IC sockets SK, the cover members 64 may be moved downwardly by an appropriate drive source to hermetically seal the through-apertures 72A of the opening/closing plate 72.

Each of the cover members is formed of, in this embodiment, a thermally insulating material, but it may be formed of a material other than a thermal insulating material since each of the through-apertures 72A of the opening/closing plate 72 is small and it suffices to maintain the interior of the box-like housing 70 in an thermally insulated condition by closing the through-apertures 72A with the cover members 64 which is formed of a material other than a thermal insulating material.

After completion of the test, once the distal ends of the movable rods 60R carrying the tested ICs have been moved out of the interior of the box-like housing 70 by the upward movement of the movable rods 60R, the opening/closing plate 72 is again moved toward the X1 direction by the extending action of the linear drive source 73 to close the through-apertures 71 of the box-like housing 70 by the opening/closing plate 72.

The provision of the construction for thermally insulating the IC sockets SK and the socket guide 35 from the outside atmosphere as described above allows for adequately raising the temperature of the socket guide 35 to a desired high temperature on the order of 150° C. by heating it with the heater 36 mounted in the socket guide 35 since the socket guide 35 is thermally isolated from the outside atmosphere. As a result, the interior of the box-like housing 70 is also maintained at the high temperature whereby the IC under test as heated by the heater plate 50, even if it is loaded with a thermal stress exceeding 125° C., may be maintained at that high temperature during the test.

In addition, the advantage of allowing for the use of various heat sources is also obtained since the temperature of the IC under test may be maintained during the test by heating either the socket guide 35 or the interior of the box-like housing 70 through other heat sources such as hot air or gases heated to a predetermined temperature, in place of the heater 36.

While in the embodiment just described above the arrangement is such that upon the IC under test contacting the IC socket SK, the through-apertures 72A of the opening/closing plate 72 are closed by the cover member 64 and sealing member 64A to the opening/closing plate 72, it should be noted that as the through-apertures 71 in the top wall of the box-like housing 70 are actually small, the through-apertures 72A of the opening/closing plate 72 are also small. Consequently, the interior of the box-like housing 70 would be kept in an almost thermally insulated condition even though the through-apertures 72A of the opening/closing plate 72 were not closed by the cover members 64 and sealing members 64 so that the temperature of the heated ICs under test may be maintained during the test. Therefore, the through-apertures 72A of the opening/closing plate 72 need not necessarily be closed.

It is also to be understood that the through-apertures 71 of the box-like housing 70 may be configured to be closed directly by the cover member 64 and sealing member 64A rather than by the opening/closing plate 72 since such configuration provides for maintaining the interior of the box-like housing 70 in a completely thermally isolated condition during the testing of an IC under test whereby the temperature of the heated IC under test may be maintained during the test.

In addition, the opening/closing plate 72 may be of a double door type construction (comprising a pair of opening/closing plates disposed in opposed abutting relation and movable toward and away from each other between closed and open positions), and may comprise a pair of opening/closing plates disposed on opposite sides of each of the through-apertures 71 of the box-like housing 70. The arrangement may be such that when the movable rod 60R is outside of the box-like housing 70, the pair of opening/closing plates are closed to close the associated through-aperture 71 in the top wall of the box-like housing 70, that when the movable rod 60R is lowered, the pair of opening/closing plates are moved to their open position to open the associated through-aperture 71 of the box-like housing 70, and that upon the IC under test being contacted with the IC socket SK, the pair of opening/closing plates are moved toward each other. With this arrangement, it is possible to keep the interior of the box-like housing 70 in a satisfactorily thermally isolated condition without the need for using the cover member 64 and sealing member 64A. It is to be understood that this arrangement also provides for maintaining the temperature of the heated IC under test during the test.

Figure 2:
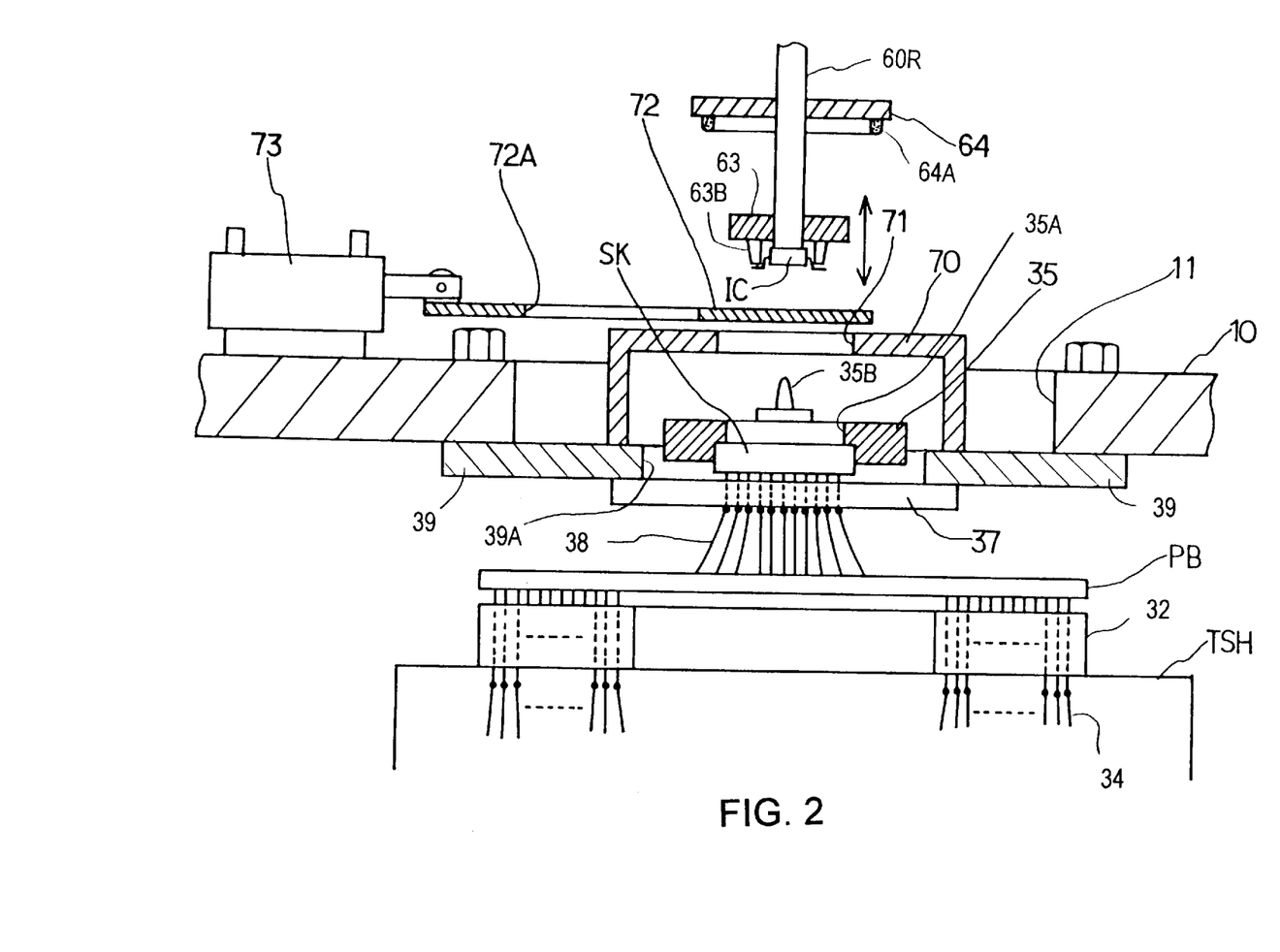
FIG. 2 is a schematic cross-sectional view illustrating the construction of the principal parts of a second embodiment of the semiconductor device testing apparatus according to the present invention.

FIG. 2 is a schematic cross-sectional view showing the construction of the principal parts of a second embodiment of the IC tester according to the present invention, and illustrates the invention applied to the IC tester of the type where mounted a predetermined distance above a performance board PB there is a socket board 37 having IC sockets SK directly attached thereto, the performance board PB and the socket board 37 being electrically connected via wires or cables 38. In FIG. 2, those portions and components which correspond to those shown in FIG. 1 are designated by like reference numerals and will not be discussed again in detail unless required. It should also be noted that the electrical connection between the performance board PB and the socket board 37 may be made via a connecting board in some instances.

The socket board 37 is fixed to a support plate 39 having formed therethrough an opening 39A sized to permit passage of the socket guide 35. Specifically, the socket board 37 is affixed to the undersurface of the support plate 39 so as to close the opening 39A to hold the IC socket SK and the socket guide 35 so as to extend upwardly through the opening 39A. The support plate 39 is secured to the bottom surface of the base 10 of the handler so as to close the through-aperture 11 formed in the base. It is thus to be understood that the IC socket SK attached to the socket board 37 and the socket guide 35 surrounding and mounted to the upper portions of the peripheries of the IC socket SK are supported so as to extend into the through-aperture 11 formed in the base 10 of the handler. While only one IC socket SK is shown in FIG. 2 just for simplicity of description, there are many instances where two or more IC sockets are used.

In this second embodiment, a box-like housing (case) 70 is mounted on the support plate 39 so as to surround the opening 39A. The IC socket SK and the socket guide 35 are accommodated in the space bounded substantially by the box-like housing 70 and the socket board 37 so that the IC socket SK and the socket guide 35 are thermally insulated from the surrounding atmosphere. While in this second embodiment the box-like housing 70 is of the construction having the bottom open, it is needless to say that the housing is also made of thermally insulating material as in the first embodiment described above.

Like the first embodiment described above, the top wall of the box-like housing 70 is formed with a through-aperture 71 in vertical alignment with the corresponding, one in this example, IC socket SK disposed in the interior of the housing. This through-aperture 71 is so sized as to permit passage of the movable rod 60R of the Z-axis driving apparatus and the guide member 63 mounted to the rod into and out of the interior of the box-like housing 70. Disposed over the top wall of the box-like housing 70 is an opening/closing plate 72 movable in the left-to-right directions. The opening/closing plate 72 is formed with a through-aperture 72A positioned so as to be vertically alignable with and having the same size of the through-aperture 71 in the top wall of the box-like housing 70 such that the through-aperture 71 of the box-like housing 70 is opened as the opening/closing plate 72 is extended toward the right direction from the position shown by a linear drive source 73 such as an air cylinder. The operation of driving the opening/closing plate 72 is similar to that in the first embodiment, and will not be described again.

In this embodiment as well, a thermally insulating cover member 64 is mounted on the movable rod 60R such that the cover member 64 will close the through-aperture 72A of the opening/closing plate 72 when the IC under test is in contact with the IC socket SK. The cover member 64 have a hermetically sealing member 64A affixed to the undersurface thereof. The cover member 64 may be fixed to the movable rod 60R at a predetermined location therealong. Or alternatively, the cover member 64 may be vertically slidably mounted on the movable rod 60R so that once the IC under test has been placed in contact with the IC socket SK, the cover member 64 may be moved downwardly by an appropriate drive source to hermetically seal the through-aperture 72A of the opening/closing plate 72.

With this construction, the IC socket SK and the socket guide 35 are thermally isolated from the outside atmosphere, whereby the socket guide 35 may be adequately heated by the heater 36 mounted in the socket guide 35 or any other heat source such as hot air heated to a predetermined temperature so that the temperature of the socket guide 35 may be raised to a desired high temperature on the order of 150° C. for example. As a result, the interior of the box-like housing 70 is also maintained at the high temperature whereby the IC under test as heated by the heater plate 50, even if it is loaded with a thermal stress exceeding 125° C., may be maintained at that high temperature during the test. It will thus be appreciated that this embodiment also provides substantially the same functional advantages as the first embodiment.

In the second embodiment described above as well, the interior of the box-like housing 70 would be kept in an almost thermally insulated condition even though the through-aperture 72A of the opening/closing plate 72 was not closed by the cover member 64 and sealing member 64A so that the temperature of the heated IC under test may be maintained during the test. Therefore, the through-aperture 72A of the opening/closing plate 72 need not necessarily be closed. Further, a modified configuration is possible in which the through-aperture 71 of the box-like housing 70 is adapted to be closed by the cover member 64 and sealing member 64A rather than by the opening/closing plate 72. In addition, the opening/closing plate 72 may be of a double door type construction comprising a pair of opening/closing plates disposed on opposite sides of the through-aperture 71 of the box-like housing 70. With either arrangement, it is possible to maintain the temperature of the heated IC under test throughout the test.

Figure 3:
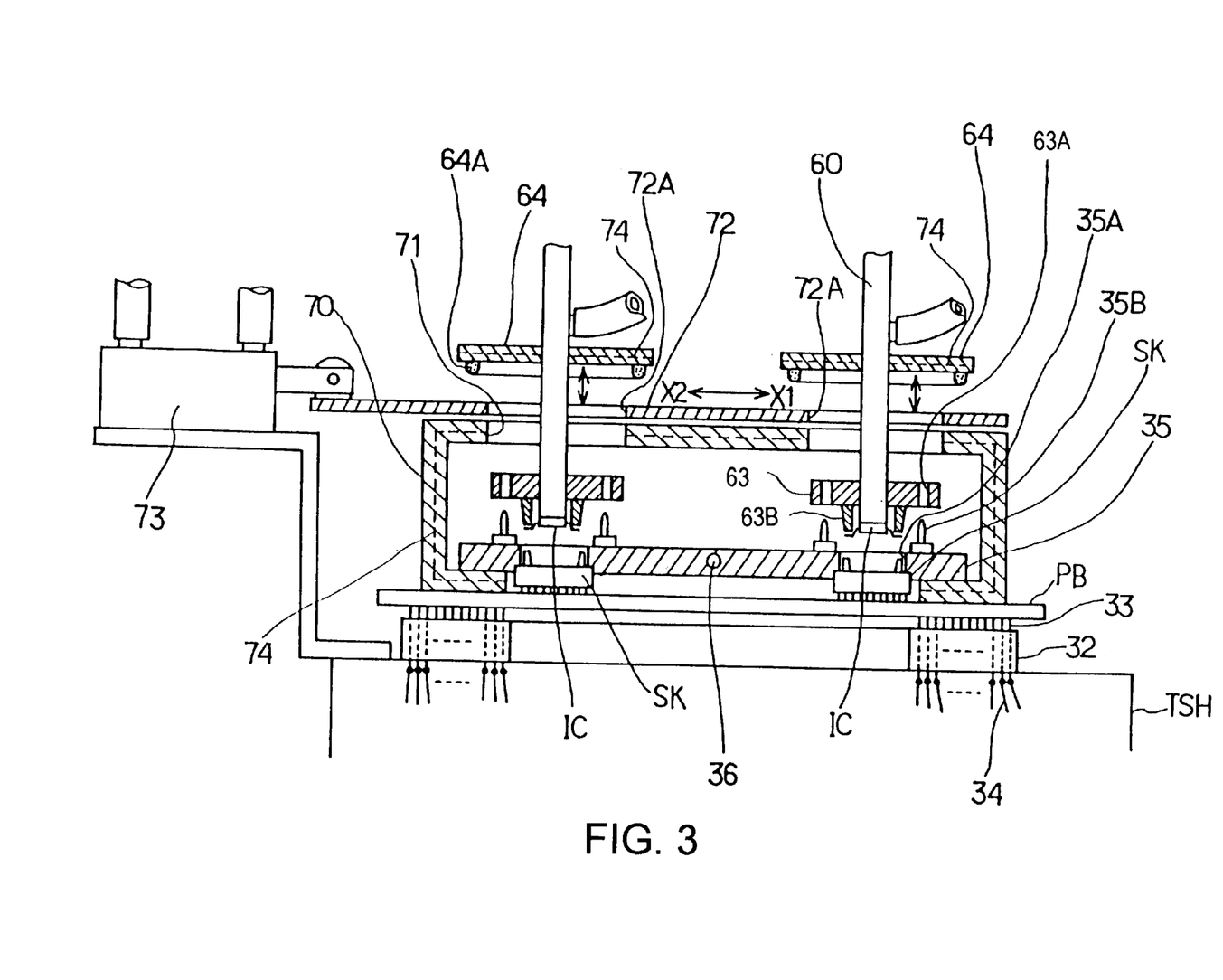
FIG. 3 is a schematic cross-sectional view illustrating the construction of the principal parts of a third embodiment of the semiconductor device testing apparatus according to the present invention.

FIG. 3 is a schematic cross-sectional view illustrating the construction of the principal parts of a third embodiment of the IC tester according to the present invention. In this third embodiment, the box-like housing 70 is constructed of components capable of providing not only thermal insulating but also electromagnetic shielding so that ICs under test, the IC sockets SK and the socket guide 35 accommodated in the interior of the housing 70 are thermally insulated from the surrounding atmosphere, and the ICs under test, the IC sockets SK and the socket guide 35 including also the surface of the performance board PB where the printed wiring (pattern) is exposed are electromagnetically shielded to thereby protect these elements and components and the exposed wiring pattern against the deleterious effects by external noises including the noise generated by the handler itself.

According to this third embodiment, in the IC tester of the construction shown in FIG. 1, electromagnetically shielding material such as a sheet metal of meshes (mesh metal) 74 is embedded in the entire wall of thermally insulating material defining the box-like housing or case 70 and in the thermally insulating cover members 64 as well. By way of example, a layer of mesh metal 74 is sandwiched between two layers of thermally insulating material which are then bonded together by a suitable adhesive or welded or heat sealed together to form a laminate having both thermally insulating and electromagnetically shielding properties.

The mesh metal 74 is electrically connected to a common point of potential on the performance board PB to electromagnetically shield the interior of the box-like housing 70. Of course, the mesh metal. 74 may be electrically connected to a common point of potential other than one on the performance board PB. In order to impart electromagnetically shielding effect to the cover member 64 as well, the sealing member 64A attached to the undersurface of the cover member 64 is formed of an electrically conductive material, and is electrically connected with the mesh metal 74 embedded in the sealing member 64. Further, the opening/closing plate 72 is formed of an electrically conductive material such as a metal plate, and is electrically connected with the common point of potential.

With this arrangement, upon the sealing member 64 being lowered to close the through-aperture 72A of the opening/closing plate 72, the sealing member 64A is electrically connected with the opening/closing plate 72 which in turn establish electrical connection between the mesh metal 74 embedded in the sealing member 64 and the common point of potential. It is thus possible to provide the cover member 64 as well with both thermally insulating and electromagnetically shielding properties.

While the embodiment shown in FIG. 3 represents an instance where the present invention is applied to the IC tester of the construction shown in FIG. 1, it will be apparent to those skilled in the art that the invention may also be applied with equal functional advantages to the IC tester of the construction shown in FIG. 2. It is noted that in FIG. 3 those portions and components which correspond to those shown in FIG. 1 are designated by like reference numerals.

As discussed above, by constructing the box-like housing 70 of a material capable of providing not only thermal insulating but also electromagnetic shielding, in addition to maintaining the interior of the housing 70 at a high temperature, it is possible by virtue of the electromagnetic shielding to prevent the ingress of noises into the interior of the housing 70 during the test. Hence, the advantage of enhancing the reliability of testing is obtained.

While in the foregoing disclosure the invention has been described with respect to the application where it is applied to the IC tester designed for testing ICs which are typical of semiconductor devices, it will be apparent to those skilled in the art that the present invention is applicable, with expected equivalent functional advantages, to various types of semiconductor device testing apparatus for testing semiconductor devices other than ICs.

It will be appreciated from the foregoing that according to the present invention, since at least the device socket and the socket guide are enclosed by the box-like housing 70 so as to be thermally insulated from the outside atmosphere, it is possible to raise the temperature of the socket guide to a desired high temperature by heating either the socket guide or the interior of the box-like housing 70 by an appropriate heat source. Accordingly, the marked advantage is provided that ICs under test loaded with a temperature stress even of a high temperature may be subjected to a test while the high temperature thermal stress is maintained.

In addition, according to the present invention, since the box-like housing 70 is provided with not only thermal insulating property, but also electromagnetic shielding property which serves to prevent ICs under test from being affected by external noises during the test. Hence, the advantage of enhancing the reliability of testing is also obtained, especially when the test is conducted on ICs with built-in logic circuitry or analog circuitry which is susceptible to the effects of noise.

What is claimed is:

1. A semiconductor device testing apparatus including:
    a device socket attached to a test head;
    a socket guide comprising a thermally conductive block, said socket guide being adapted to surround said device socket and align an incoming semiconductor device as carried by a Z-axis drive means with said device socket; and
    a heat source for heating said socket guide; said semiconductor device testing apparatus being characterized by comprising:
        a box-like housing constructed of a thermally insulating material, said housing substantially enclosing said device socket and said socket guide;
        a through-aperture formed in the top of said box-like housing for passing the incoming semiconductor device as carried by the Z-axis drive means into the interior of said box-like housing; and
        an opening/closing means for selectively opening and closing said through-aperture formed in the top of said box-like housing.

2. The semiconductor device testing apparatus according to claim 1, wherein said device socket is attached to a performance board mounted to said test head, said box-like housing enclosing said device socket and said socket guide overlying said performance board.

3. The semiconductor device testing apparatus according to claim 1, wherein said device socket is attached to a socket board disposed at a predetermined distance above a performance board mounted to said test head, said box-like housing enclosing said device socket and said socket guide overlying said socket board.

4. The semiconductor device testing apparatus according to any one of preceding claims 1 to 3, wherein said opening/closing means comprises a plate-like opening/closing member having a portion for closing said through-aperture formed in the top of said box-like housing and an opening portion for opening said through-aperture, said plate-like opening/closing member being disposed so as to be horizontally movable across the top of said box-like housing.

5. The semiconductor device testing apparatus according to claim 4, including a cover member mounted on said Z-axis drive means, said cover member being adapted to close said opening portion of said plate-like opening/closing member when said moved to a position to open said through-aperture formed in the top of said box-like housing and said incoming semiconductor device as carried by the Z-axis drive means has been brought into contact with said device socket within said box-like housing.

6. The semiconductor device testing apparatus according to claim 5, wherein said cover member for closing said opening portion of said plate-like opening/closing member is fixed to said Z-axis drive means at a predetermined position therealong.

7. The semiconductor device testing apparatus according to claim 5, wherein said cover member for closing said opening portion of said plate-like opening/closing member is mounted on said Z-axis drive means for movement therealong.

8. The semiconductor device testing apparatus according to claim 5, wherein said cover member for closing said opening portion of said plate-like opening/closing member is constructed of a thermally insulating material.

9. The semiconductor device testing apparatus according to claim 5, wherein said cover member for closing said opening portion of said plate-like opening/closing member is constructed of an electromagnetically shielding material.

10. The semiconductor device testing apparatus according to claim 5, wherein said cover member for closing said opening portion of said plate-like opening/closing member is constructed of thermally insulating material containing electromagnetically shielding material.

11. The semiconductor device testing apparatus according to claim 5, wherein said cover member for closing said opening portion of said plate-like opening/closing member has a hermetically sealing member attached to the undersurface thereof.

12. The semiconductor device testing apparatus according to claim 11, wherein said plate-like opening/closing member is constructed of electrically conductive material, said cover member for closing said opening portion of said plate-like opening/closing member is constructed of thermally insulating material containing electromagnetically shielding material, and said hermetically sealing member attached to the undersurface of said cover member is constructed of electrically conductive material.

13. The semiconductor device testing apparatus according to any one of preceding claims 1 to 3, wherein said opening/closing means comprises a cover member mounted on said Z-axis drive means and adapted to close said through-aperture formed in the top of said box-like housing upon said incoming semiconductor device as carried by the Z-axis drive means being brought into contact with said device socket within said box-like housing.

14. The semiconductor device testing apparatus according to claim 13, wherein said cover member is fixed to said Z-axis drive means at a predetermined position therealong.

15. The semiconductor device testing apparatus according to claim 13, wherein said cover member is mounted on said Z-axis drive means for movement therealong.

16. The semiconductor device testing apparatus according to claim 13, wherein said cover member is constructed of a thermally insulating material.

17. The semiconductor device testing apparatus according to claim 13, wherein said cover member is constructed of an electromagnetically shielding material.

18. The semiconductor device testing apparatus according to claim 13, wherein said cover member is constructed of thermally insulating material containing electromagnetically shielding material.

19. The semiconductor device testing apparatus according to claim 13, wherein said cover member has a hermetically sealing member attached to the undersurface thereof.

20. The semiconductor device testing apparatus according to claim 19, wherein said cover member is constructed of thermally insulating material containing electromagnetically shielding material while said hermetically sealing member attached to the undersurface of said cover member is constructed of electrically conductive material.

21. The semiconductor device testing apparatus according to any one of preceding claims 1 to 3, wherein said opening/closing means comprises a pair of opposed plate-like opening/closing members disposed on opposite sides of said through-aperture over the top of said box-like housing, said opposed plate-like opening/closing members being movable toward and away from each other.

22. The semiconductor device testing apparatus according to claim 21, wherein said pair of opposed plate-like opening/closing members are constructed of thermally insulating material.

23. The semiconductor device testing apparatus according to claim 21, wherein said pair of opposed plate-like opening/closing members are constructed of electromagnetically shielding material.

24. The semiconductor device testing apparatus according to claim 21, wherein said pair of opposed plate-like opening/closing members are constructed of thermally insulating material containing electromagnetically shielding material.

25. The semiconductor device testing apparatus according to any one of preceding claims 1 to 3, wherein said box-like housing is constructed of thermally insulating material containing electromagnetically shielding material.

26. The semiconductor device testing apparatus according to claim 25, wherein said electromagnetically shielding material contained in said thermally insulating material is metal mesh.

27. The semiconductor device testing apparatus according to any one of preceding claims 1 to 3, wherein said heat source comprises a heater mounted to said socket guide.

28. The semiconductor device testing apparatus according to any one of preceding claims 1 to 3, wherein said heat source comprises air or gas heated to a predetermined temperature.

* * * * *